United States Patent [19]

Miska et al.

[11] Patent Number: 5,646,369

[45] Date of Patent: Jul. 8, 1997

[54] SEGMENTED SHIELDING STRUCTURE FOR CONNECTOR PANELS

[75] Inventors: Stanley R. Miska, Pittsford; Daniel T. Courtney, Palmyra; Kenneth W. Hermann, Rochester, all of N.Y.

[73] Assignee: Schlegel Corporation, Rochester, N.Y.

[21] Appl. No.: 442,027

[22] Filed: May 16, 1995

Related U.S. Application Data

[63] Continuation-in-part of Ser. No. 415,627, Apr. 3, 1995.
[51] Int. Cl.$^6$ .................................................. H05K 9/00
[52] U.S. Cl. ............................ 174/35 GC; 174/35 R; 174/35 MS
[58] Field of Search ................. 174/35 R, 35 GC, 174/35 MS; 361/816, 818; 156/502; 277/227, 228, 229, 235 R

[56] References Cited

U.S. PATENT DOCUMENTS

| | | | |
|---|---|---|---|
| 3,140,342 | 7/1964 | Ehrreich et al. | 174/35 |
| 4,201,825 | 5/1980 | Ebneth | 174/35 MS |
| 4,310,946 | 1/1982 | Baker et al. | 15/363 |
| 4,383,694 | 5/1983 | Fontana | 277/231 |
| 4,608,453 | 8/1986 | Baker | 174/35 |
| 4,977,296 | 12/1990 | Hemming | 174/35 MS |
| 5,008,485 | 4/1991 | Kitagawa | 174/35 GC |
| 5,105,056 | 4/1992 | Hoge, Jr. et al. | 174/35 GC |
| 5,202,536 | 4/1993 | Buonanno | 174/35 GC |

OTHER PUBLICATIONS

Machine Design, vol. 47, No. 19 (Aug. 7, 1975) pp. 74–77.

Primary Examiner—Bot L. Ledynh
Attorney, Agent, or Firm—Eckert Seamans Cherin & Mellott

[57] ABSTRACT

An EMI gasket blocks electromagnetic radiation between electrically conductive bodies and encompasses an area using a number of adjacent segments, each generally formed as a resilient core section. An electrically conductive surface material bears against the conductive bodies and extends over the segments, the surface material preferably being formed of a metallized polymer sheet. The polymer sheet is coupled through between the opposite faces of the gasket along lengthwise seams where either the sheet is depressed into the seam or coupled by a conductive adhesive, such that the opposite faces of the gasket are electrically coupled between the segments. The conductive material extending through the gasket to couple the opposite faces provides conducting paths that improve shielding efficiency. The seal can be die cut, including cutting through the width of one or more segments, and remains intact, providing many of the benefits of both wide seals or gaskets and elongated narrow seals.

20 Claims, 4 Drawing Sheets

SEGMENTED SHIELDING STRUCTURE FOR CONNECTOR PANELS

CROSS-REFERENCE TO RELATED APPLICATION

This application is a continuation-in-part of copending application no. 08/415,627, filed Apr. 3, 1995.

BACKGROUND OF THE INVENTION

1. Field of the Invention

The invention relates to the field of electromagnetic shielding via conductive gaskets that bridge across openings between parts of conductive housings. According to the invention the shielding structure is defined by a plurality of resilient conductively wrapped segments, electrically coupled together by conductive tape or the like to form a gasket. The invention is particularly useful for shielding relatively large areas such as bypass panels at which input/output lines traverse the boundary of a shielded enclosure, typically via connectors. The segmented structure is such that the conductive path from a given point on the panel to a given point on the housing or other ground point, is shorter and/or lower in resistance than in a non-segmented arrangement, which improves shielding efficiency as compared to a similar gasket that is continuous rather than segmented.

2. Prior Art

To reduce problems due to alternating electromagnetic fields emanating from electronic equipment and/or due to the tendency for incident electromagnetic fields to affect sensitive circuits, a conductive barrier or shield is placed along the path of field propagation to provide a discontinuity. The conductive barrier typically is coupled electrically to a circuit ground. Part of the electromagnetic energy incident on the shield is reflected, and part of the energy induces currents in the shield. These currents are dissipated as eddy currents. The field is attenuated by the shield.

Conventional shielding typically uses the external housing of an article of electronic equipment for at least part of the shield barrier. In addition, internal shield barriers, enclosures, ground planes and the like can be provided for particular circuit elements within the enclosure. For these purposes, sheet metal materials, laminates of metal and plastic and/or conductive coatings typically form the conductive electromagnetic shield barrier.

Many modern electronic devices emit or are sensitive to electromagnetic interference or "EMI" at high frequencies. For example, computer clock and digital data signals, phase locked loops, switched mode power supplies, various radio frequency and microwave devices and the like are sources of EMI. Many such electronic circuits also are susceptible to EMI, and must be shielded in order to operate properly.

The effectiveness of a shield is a function of a number of factors including the electrical properties of the shield material (e.g., conductivity and magnetic permeability), the thickness and continuous or discontinuous nature of the shield, the frequency of the EMI, the spacing and configurations of the EMI source and the shield, etc. For shielding relatively higher frequencies, any gaps in the conductive material must be smaller to prevent leakage as compared to shielding lower frequencies.

The frequencies to be attenuated include harmonics. For a computer, for example, having a basic clock frequency of 25 to 100 MHz, significant harmonics may be present up to 900 MHz or more. Effective shielding requires a nearly continuous (i.e., gapless) shield, preferably arranged close to the source of EMI and/or close to the susceptible circuit, and made of a highly conductive material.

Typically, shielding is provided by a conductive enclosure made of thin sheet metal, metallized plastic or the like. An external housing can form a conductive shielding enclosure, and shielding subenclosures can be provided for subassemblies within the housing. Effective shielding advantageously includes conductive EMI blocking gaskets that continue the conductive barrier of a shield across any gaps or seams between conductive panels, enclosures, doors, housing elements and the like, which form portions of the shield.

Resiliently compressible conductive gasket structures are disclosed, for example, in U.S. Pat. Nos. 4,857,668—Buonanno; 5,045,635—Kaplo et al.; and 5,202,536—Buonanno, which are hereby incorporated. According to these patents, a conductive sheet material such as a woven or unwoven metalized plastic fabric is provided on a resilient compressible core of indefinite length to form an elongated linear gasket that can be placed between conductive panels to bridge any gap between them, e.g., due to discontinuities and the like. One possible conductive material is Monsanto "Flectron" nickel/copper metallized polyester fabric.

A conductive gasket as described can be formed in various cross sectional shapes, including round, rectangular and irregular shapes, and can be provided with an attachment means such as a clip or an adhesive area, to assist in mounting. Conductive gaskets can be made to the specific shape and area needed to reside between the conductive surfaces between which they are to seal, but it is generally more difficult and expensive to provide customized shapes and sizes. In addition, conductive gaskets for large sealing areas are more difficult to make than small area gaskets. As a result, relatively slender linear conductive gaskets or seals are generally mounted so as to define lines electrically connecting between conductive panels. Where an opening is to be provided, the linear seals are arranged around the perimeter of the opening.

For a conductive gasket comprising a conductive sheet on a resilient core, the core can be molded, extruded, cut from a block of resilient stock, etc. The conductive sheet can be wrapped on the core and affixed, for example, by adhesive. According to the above Buonanno patents, the core also can comprise a polymer with a foaming agent, applied as a liquid to a woven or non-woven metallized fabric that is wrapped, for example into a closed shape. The polymer expands to fill the void and as the polymer cures, it engages securely with the fabric.

Providing and wrapping a resilient core can be accomplished readily for substantially linear gaskets in round, oval, rectangular or complex cross sectional shapes that cover a small surface area. Where the surface area is larger, and particularly where the thickness between opposite surfaces is minimal, it may be difficult to form and/or wrap the gasket in a manner that provides an accurate shape and a smooth conductive covering. On the other hand, slender linear gaskets are not suitable for all EMI sealing applications, for example, where a substantial area of abutment between housing elements is to be sealed and/or when the sealed surface is discontinuous, for example, to allow clearance for connectors.

For larger areas, it would be possible to provide a pattern of linear seals to seal between the surfaces. Linear seals could be arranged around the perimeters of openings for connectors and the like, to allow clearance while sealing between the conductive panels. But this is cumbersome. A customized wide area gasket with clearance openings is possible, but this may be cumbersome and expensive to produce.

Another difficulty with wide area gaskets is that assuming the compressible core is not conductive, then the shortest conductive path from any point on one side of the gasket to any point on the opposite side must pass clear across the surfaces on opposite sides of the gasket to the edge. Therefore, wide gaskets may be characterized by a relatively higher point-to-point resistance and reduced EMI shielding efficiency as compared to a plurality of individual elongated seals. On the other hand, individual seals are more complicated to mount.

What is needed is an improved means for sealing wide areas, having the ease of manufacture of a simple elongated linear seal of preferably regular shape, and the versatility and wide area coverage of a more customized shape. Advantageously, such a gasket would also have a low resistivity.

According to the present invention, a large area EMI sealing gasket is provided in the form of a sheet, made by attaching a plurality of laterally adjacent elongated segments using conductive tape or the like. The sheet can be die cut to size and to provide clearance openings, including openings larger than a segment width. Moreover, whereas the segments as thereby connected provide additional and shorter paths between the sealed surfaces than a comparably sized continuous seal or gasket, the shielding efficiency of the shield is in fact improved rather than diminished, due to its segmented form.

SUMMARY OF THE INVENTION

It is an object of the invention to provide a relatively wide area EMI shielding seal or gasket that has a high shielding efficiency and is easy and inexpensive to manufacture and use.

It is also an object of the invention to provide a sheet-like gasket that is readily cut to form openings providing clearance for connectors, circuit card end plates and the like.

It is another object to apply easily manufactured elongated seal structures to sealing over a wide area that may have a complex configuration, without requiring attention to placing the elongated seal structures along edges to be sealed.

It is also an object to provide a versatile seal arrangement that can accommodate irregular shapes and surfaces as well as sealing arrangements where conductive material is to be placed in specific areas and not others.

It is a further object to facilitate accurate mounting and positioning of a sheet-like gasket.

It is another object of the invention to facilitate manufacture of a segmented seal using efficient means for conductively joining opposite sides of the gasket along seams between the segments.

These and other objects are accomplished by an EMI seal or gasket that blocks electromagnetic radiation between electrically conductive bodies and encompasses an area using a number of adjacent segments, each generally formed as an elongated seal with a resilient core and each preferably being substantially enclosed by an electrically conductive surface for bearing against the conductive bodies. The segments are attached to one another along lengthwise seams, preferably using conductive tape on one or both opposite sides of the gasket. The conductive surface preferably is provided by a metallized fabric affixed to a resilient foamed polymer core, which can be molded in the fabric or otherwise formed or cut and attached. The fabric can extend substantially around the segments or be conductively joined between the segments. This structure provides more and shorter conductive paths across the gap between the conductive bodies, as compared to a nonsegmented gasket of comparable size, thereby improving shielding efficiency. The gasket can be die cut, including cutting through the width of one or more segments, and remains intact. The segments can be of uniform or different shapes, sizes and conductivity. The segmented gasket as described provides many of the benefits of both wide seals or gaskets having a conductive surface material, and elongated narrow seals, but with improved shielding effectiveness and versatility, and reduced costs.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
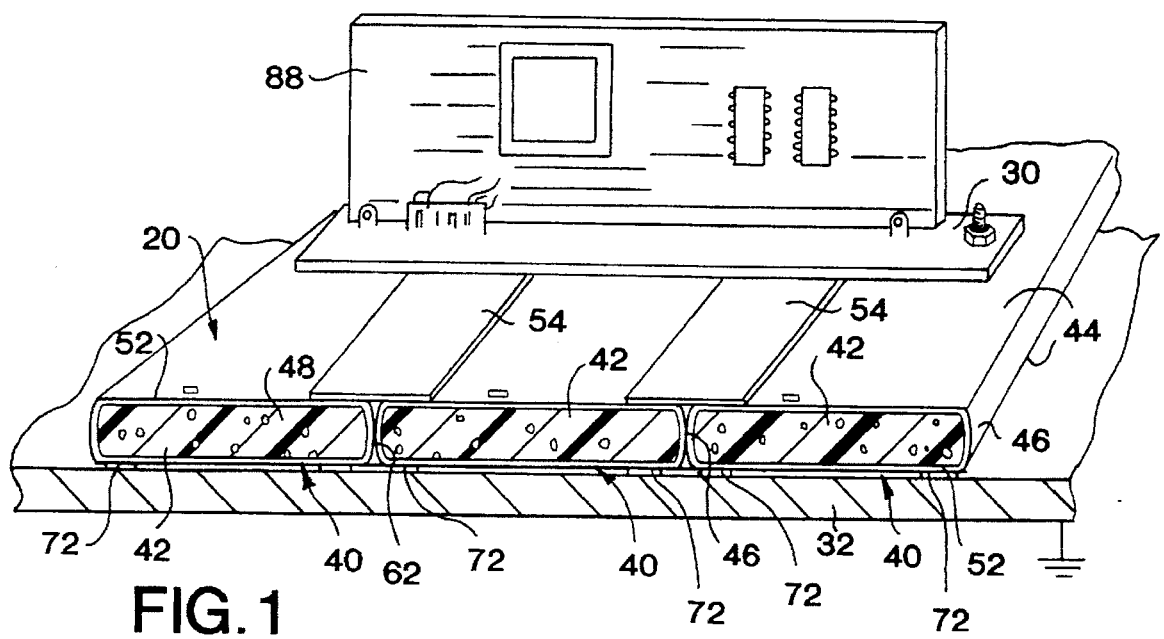
FIG. 1 is a perspective partly sectional view illustrating a segmented gasket according to the invention, for sealing between conductive bodies.
Figure 2:
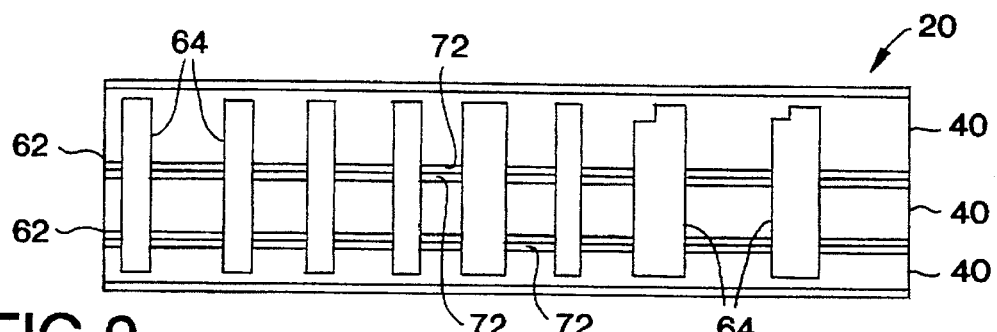
FIG. 2 is a plan view of an exemplary segmented seal or gasket as shown in FIG. 1.
Figure 3:
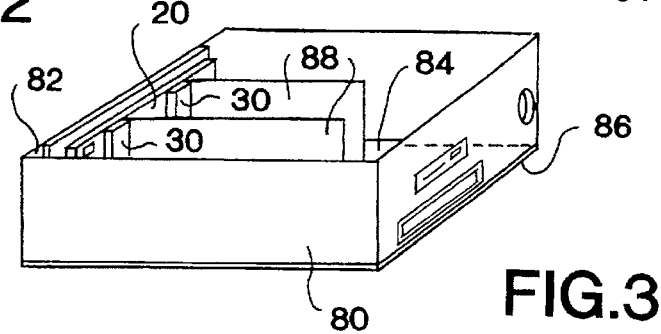
FIG. 3 is a perspective view of an exemplary housing for an electronic device, wherein the gasket seals between the external housing and circuit card end panels.

FIGS. 1–3 show an exemplary embodiment of an EMI sealing gasket 20 formed of electrically coupled elongated sealing segments according to the invention. The gasket 20 can be sandwiched between various forms of conductive panels and the like, and is shown in FIG. 1 sandwiched between the metal flange 30 of a circuit card and a conductive backplane 32 of a chassis. The gasket 20 is useful for a wide range of EMI sealing applications, and is particularly advantageous for sealing a relatively wide area between circuit elements, subenclosures, housings and other conductive bodies, wherein the area requires one or more clearance openings through the seal. At such clearance openings, as discussed in detail below, the gasket provides a conductive electrical connection between the conductive bodies, extending around the periphery of the clearance opening. This avoids the need to mount linear seals around the periphery.

Moreover, due to the segmentation of the gasket, sealing gasket 20 provides enhanced electrical coupling and improved sealing efficiency as compared to a gasket of comparable size that is not segmented. Between points on opposite sides of the segmented gasket, the conductive path passes partly along sidewalls of the segments, which would not be present in an unsegmented gasket arrangement having a conductive surface limited to its external faces and edges. Thus the path of least resistance between points on opposite sides of the gasket is shorter and comprises more conductive material than in an unsegmented gasket having an otherwise comparable structure, thereby improving the efficiency of the gasket in blocking EMI.

The gasket shown in FIG. 1 has three seal segments 40, two outer segments and a center segment, each of which is elongated and adjacent at least one other segment. It would also be possible to provide segments in other shapes, for example being laterally elongated rather than longitudinally or made in other shapes that can reside alongside one another. Each segment 40 has a resilient core 42 which in this embodiment is generally rectangular in cross section. The number of segments can be varied, it being preferred to use as many segments as needed to cover the required area, each segment being of a width limited to an easily produced width characteristic of linear seals, for example about 1–3 inches (2.5–7.5 cm) in width.

The seal segments 40, and gasket 20 as a whole, need only be sufficiently thick to encompass the expected variations in the width of the gap between the sealed conductive bodies 30, 32. Gasket 20 is held with some compression between bodies 30, 32, and is sufficiently resilient to conform closely to both conductive bodies. Where appropriate, for example to seal against a surface other than a flat surface such as along a ridge or groove, individual segments can have a different size, shape, width or thickness than the adjacent segment(s). It may also be appropriate to vary the thickness or width of segments between flat conductive bodies, for example providing thicker segments for higher compression and better electrical contact in some areas as opposed to others, such as along the outer borders of a gasket.

Each segment 40 has first and second contact surfaces for bearing against bodies 30, 32 on opposite sides of gasket 20. Segments 20 likewise have opposite elongated edge surfaces 46, which abut one another in the embodiment of FIG. 1, and end surfaces 48. In this embodiment, the resilient core 42 is substantially surrounded by an electrically conductive material 52 which preferably covers at least contact surfaces 44 and edge surfaces 46. Insofar as the gasket is cut through, for example along end surfaces 48 and perhaps along one or more outer edge surfaces 46, resilient core 42 is exposed.

The resilient core 42 can be conductive or nonconductive and can be a rubber or a polymer, provided the core is sufficiently resilient to press the conductive covering material 52 into good electrical contact with the bodies 30, 32 to be sealed. Core 42 can be molded, extruded, cut from a block, cured in place, etc. Preferably core 42 comprises a polymer such as foamed polyurethane or the like.

The electrically conductive material 52 can comprise various forms of woven or non-woven conductive material sufficiently flexible to conform to the contour of conductive bodies 30, 32. For example, metal foil, screen, wire mesh, braided, woven or knitted wire or metalized fibers, and the like, made from or incorporating metal sheet, fibers or particles, can provide a sufficiently flexible and electrically conductive surface. Preferably, covering material 52 comprises a fabric or thin batt incorporating metal fibers, metal alloy fibers or metallized synthetic fibers. Alternatively or in addition, a conductive coating can be provided in the form of a cured polymer incorporating a suspension of conductive particles, such as a colloidal suspension of conductive carbon particles, e.g., carbon black or specifically acetylene black. In a preferred embodiment, the covering material 52 comprises a woven or non-woven fabric of metallized nylon (polyamide) fibers. In a non-woven fabric, the fibers or filaments can be spunbonded or chemically bonded or heat bonded to maintain integrity, and either metallized by a plating technique or originally formed to include metal particles, fibers or filaments. In a woven fabric, Monsanto "Flectron" nickel/copper metallized polyester fabric or the like can be used as the conductive surface material 52. The primary functions of the surface material are to provide a conductive surface for engaging electrically with bodies 30, 32, and an electrical connection between opposite faces or sides 44 of segments 40.

Segments 40 are placed adjacent to one another in a coplanar configuration, preferably abutting along their narrower edges 46, and are coupled together mechanically and electrically. In the embodiment shown in FIG. 1, segments 40 are coupled in a hinge like fashion using lengths of flexible conductive tape 54, preferably applied along longitudinal seams 62. The conductive tape 54 can comprise a material similar to that of surface covering 52, for example, adhered over at least a portion of the width of the adjacent segments at each seam by a conductive adhesive or by a heat bonding technique such that the surface of gasket 20 bearing the conductive tape is substantially evenly smooth for good conformity with the respective conductive body 30, 32.

Conductive tape 54 can be applied to both opposite contact surfaces 44, but the embodiment of FIG. 1 has the segments joined together by conductive tape applied exclusively to one of the opposite contact surfaces 44. An advantage of applying conductive tape 54 to one contact surface of the adjacent segments 40 (as opposed to both) is that the two adjacent segments 40 can hinge or fold freely between the coplanar position, as shown in FIG. 1, through a 180° range of motion until the contact surfaces of the two adjacent segments contact each other, to stack segments 40. Of course the gasket can also accommodate curves, bends or angles to any point within the range.

It is appreciated that a variety of conductive tape and segment configurations are possible. A seal can be formed with multiple segments wherein one or more adjacent segments are joined by conductive tape applied to a first of the opposite contact surfaces and one or more adjacent segments are joined by conductive tape applied to the opposite contact surfaces, alternating the direction in which the segments can be bent or folded.

Alternatively, the conductive tape can be applied to the first contact surface of one adjacent segment and the opposite contact surface of the next adjacent segment, permitting two adjacent segments to hinge or pivot in either direction. Such an arrangement is not preferred if the conductive tape is not attached along the edge surface 46 of at least one of the adjacent segments, so that the segments cannot be pulled laterally away from one another, leaving a gap. For those applications requiring maximum seal strength and rigidity, as opposed to flexibility, conductive tape can be applied to both opposite sides of the two adjacent segments. Additionally, those edge surfaces that have been cut through and where as shown in FIG. 1 the core 42 is not covered with the conductive material, can be wrapped in conductive tape to further encapsulate the resilient core and to provide additional conductive material bridging between the sealed conductive bodies.

FIG. 2 is a plan view of an exemplary embodiment of the gasket 20, from the bottom in FIG. 1, namely on the side opposite from the conductive tape 54. This gasket is suitable, for example, to seal between a conductive housing and the end flanges of circuit cards, for example metal grounded plates conventionally attached to certain types of circuit cards and including connectors for signal or power lines to traverse a shielding barrier. The gasket can be used, for example, in a computer chassis for this purpose, and in that application can be, for example, approximately 30 cm long, 13 cm wide and 0.3 cm thick. The specific dimensions of the seal of course can be varied over a wide range of sizes, shapes and/or combinations of sizes and/or shapes, to suit the application.

Referring to FIG. 2, in this embodiment the seal is formed with a plurality of clearance openings 64 which traverse the two opposite contact surfaces 44 and a portion of the resilient core 42 at each opening 64. The openings preferably are die cut after continuous segments 40 have been attached together to form a sufficient width, the die cuts forming the pattern of openings needed for a particular device, and potentially also cutting through one or both of the endmost segments to provide a gasket width that is less than an integer multiple of the segment width. The openings and the gasket width can also be formed by other methods involving cutting or the assembly of short segment lengths so as to define the required clearance openings 64.

The width of the openings as shown can exceed the width of one or more segments 40 between the endmost segments, which makes that segment (the center segment in FIG. 2) discontinuous along its length. Nevertheless, the gasket 20 extends continuously around the perimeter of each clearance opening where, preferably, at least a portion of the gasket is compressed between facing surfaces of bodies 30, 32.

Adhesive strips 72 preferably are applied to at least one of the opposite contact surfaces 44 as shown in FIGS. 1 and 2, and can have pull-off film covering the adhesive until the gasket 20 is ready to install on a conductive surface of bodies 30 or 32. Alternatively, other forms of fasteners can be provided, such as holes to receive screws or rivets or the like.

The seal is particularly suitable for shielding within the chassis of an electronic device such as a digital computer, communications apparatus or the like having a plane of connectors or similar terminations that need to traverse the shield barrier, usually via shielded conductors. FIG. 3 shows how the invention can be applied to a typical personal computer chassis 80 having a backplane 82 formed with a plurality of openings which correspond one for one with a plurality of connector sockets (not shown) on the computer motherboard 84 mounted on the bottom 86 of chassis 80 for receiving circuit cards 88. This type of chassis, motherboard and circuit card configuration is well known for PC compatible personal computers, providing a series of circuit card positions that are initially closed by cover plates (not shown) and can be populated with any of various types of circuit cards 88, frequently having end flanges 30 that usually have connectors. The chassis and backplane are grounded and form a part of the shielding barrier. The gasket of the invention is advantageously placed over the backplane and continues the conductive seal barrier across any gaps between the backplane and the circuit card end flanges 30 (or perhaps the cover plates for empty circuit card positions).

Gasket 20 overlaps both the inner surface of the backplane and the rear facing surface of the circuit card flange or other conductive body 30 disposed inside of the shield barrier. The gasket 20 is preferably attached to backplane 82 via adhesives or fasteners or the like, the number, shape and position of the openings 64 in the gasket corresponding to the number, shape and position of the openings in the backplane. Returning briefly to FIG. 1, the seal is sandwiched between flange 30 and backplane 32 (or 82 in FIG. 3), the seal providing a resilient sealing surface between the flange and the backplane. In operation the seal is compressed, as shown in FIG. 4, to provide maximum electrical continuity between the seal and the flange or the seal and the backplane in the particular application.

The electrical circuitry on the motherboard and/or printed circuit cards generates varying levels of EMI. The EMI which is incident on gasket 20 is reflected or dissipated in the form of currents including conduction through gasket 20 to ground. Gasket 20 according to the invention appears to be less continuous than a comparable gasket having a single integral core of the full gasket width and a conductive surface extending continuously around the core. However, the invention is in fact characterized by shorter conductive paths and therefore lower electrical resistance between any two given points, for example on opposite sides of the gasket. Therefore, the invention has better shielding efficiency than a continuously wrapped single core of the same size and electromagnetic characteristics.

Figure 4:
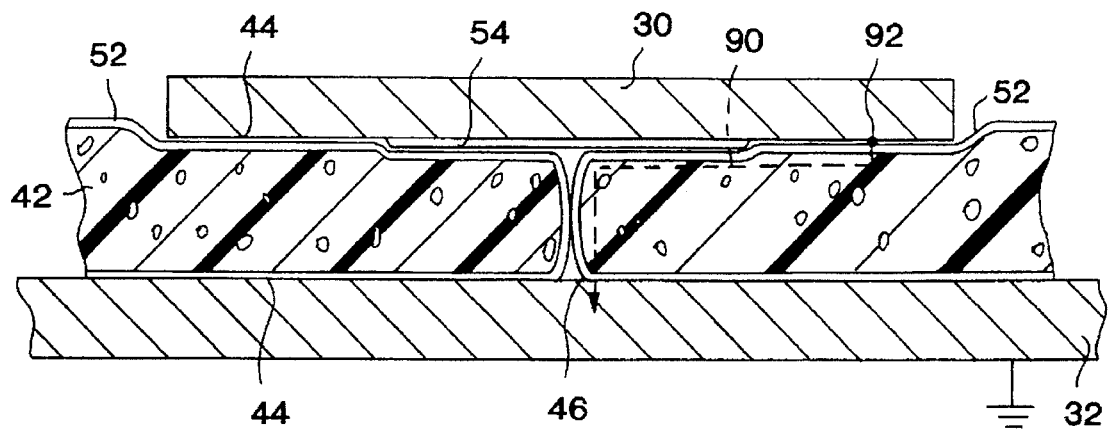
FIG. 4 is a section view through a portion of the segmented gasket according to one embodiment, taken along the line of elongation of the segments, the segments being coupled via a conductive tape.

This can be appreciated with reference to FIG. 4. A potential relative to ground induced at a given point 92 on the conductive covering 52 on the first contact surface 30 (e.g., facing the motherboard and printed circuit cards in FIG. 3) induces a current that is coupled to ground (assumed to be the chassis backplane 32 or 82) along a path (shown in a heavy broken line) through the conductive material of covering 52 to the opposite contact surface 44, which bears against the backplane. FIG. 4 is a detail view showing portions of two adjacent segments of the seal affixed between the conductive bodies, the potential being assumed to be induced on the top surface in FIG. 4 to be sinked at a ground coupled to the bottom surface. Shielding efficiency compared to nonsegmented configuration is improved because the segmented structure of the seal provides shorter conductive paths for eddy currents, as shown by dotted line arrow 90. This path goes along the edge surface 46 of the subject segment.

Actually, the path for the current includes all the paths that couple between the point 92 of the potential and ground. These paths effectively form parallel electrical resistances that commonly define the resistance between the two reference points at the induced potential and at ground. Whereas the invention provides shorter and more numerous paths than a continuously wrapped arrangement in which the paths necessarily pass around the extreme edges of the gasket, the resistance is less and the shielding effectiveness of the invention is greater than in the continuously wrapped gasket.

Figure 5:
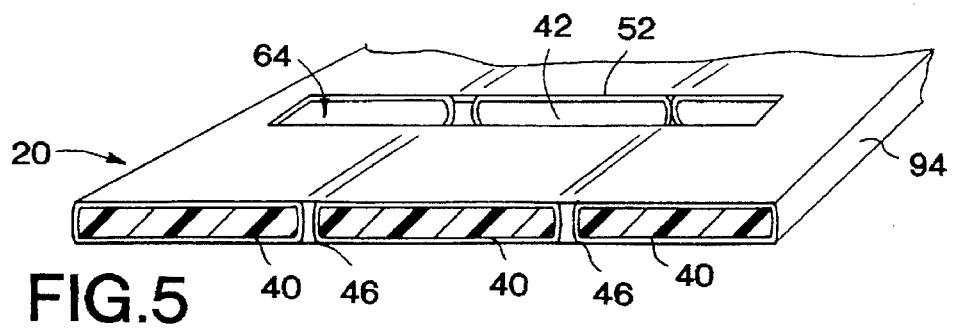
FIG. 5 is a partial perspective view of a portion of the segmented gasket according to an alternative embodiment and including clearance openings, the segments being coupled via a conductive adhesive.

FIG. 5 illustrates an alternative embodiment wherein the segmented gasket is cut not only at a clearance opening 64, but also along one edge 94, at which the conductive covering 52 has been cut away for providing the desired width of the gasket 20. According to this embodiment, a potential adjacent the cut edge represents a worst case condition wherein the path to the opposite side passes around the edge surface 46 of the associated segment. This path is longer than if the edge is not cut, but due to segmentation according to the invention, the worst case path is still, at most, a fraction of the circumference of a single segment. FIG. 5 also illustrates an embodiment wherein the conductive tape joining adjacent segments has been replaced by a conductive adhesive that holds the edges 46 of adjacent segments in abutment.

In a preferred embodiment, conductive tape 54 can be the same type of material as the conductive covering 52, such as a conductive metallized fabric. A foil, conductive polymer layer or similar structure providing a conductive material bridging over the seam is also possible, these being exemplified generally by conductive tape. The conductive tape 54 preferably is affixed to covering 52 using a conductive adhesive. The conductive adhesive has a volume conductivity and joins the conductive tape 54 to the conductive covering 52 relatively fully over the area of overlap. It is also possible to employ a nonconductive adhesive where the area and/or intimacy of conductive contact between tape 54 and covering 52 provides the necessary electrical connection.

Figure 6:
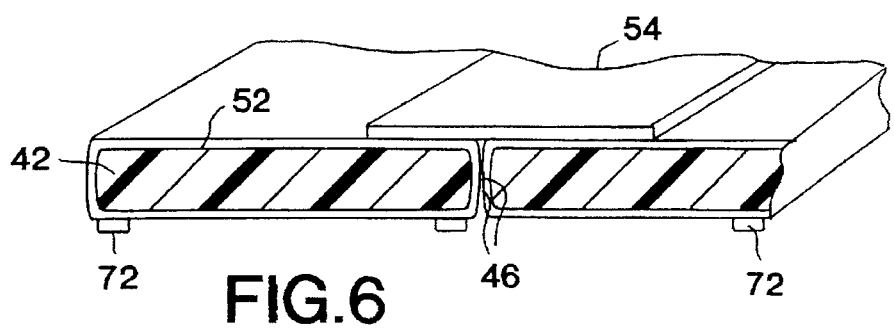
FIG. 6 is a partial perspective view showing a further alternative embodiment, including adhesive strips facilitating mounting of the segmented gasket.

A preferred arrangement of the segments is shown in FIG. 6. In this embodiment, conductive tape 54 joins over adjacent segments and holds their edges 46 against one another. The tape 54 is provided only on one side, and on the opposite side thin adhesive strips 72 are provided (see also FIGS. 1 and 2). The adhesive strips can be provided in whatever arrangement that is convenient for holding the gasket in place, at least temporarily until it is affixed by engagement between conductive bodies 30, 32. Of course other means for attaching the gasket to the bodies such as fasteners, complementary contours for receiving the gasket and the like, can be employed instead of or in addition to adhesive strips 72.

In addition to the different choices of materials and structural arrangements discussed above, the invention is subject to other variations which are apparent in view of the foregoing examples. For example, the invention is disclosed in the form of a relatively thin and flat gasket suitable for sealing between flat conductive members. The segmentation also allows the gasket to smoothly seal curves, at least on one axis of curvature parallel to the seams between segments. A two dimensional array of segments could be employed to seal around a curve in two axes, or a more complex shape. The invention could also be configured such that edges 46 having a greater dimension than the width of contact faces 44, or these two dimensions could be equal in a gasket where the segments are substantially square in cross section.

Likewise, not all the segments need to be the same size or shape. For example, the segments in certain areas can be thicker than in other areas so that the compression is greater at the thicker segments. Nor must all the segments be conductive. It is possible in certain applications to employ nonconductive segments, for example, in one or more intermediate segments, with conductive segments at the edges.

Figure 7:
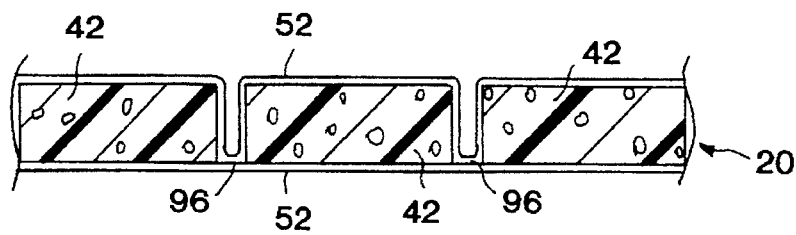
FIG. 7 illustrates a first alternative embodiment wherein the conductive surface material is joined across the gasket along depressed seam lines.

Other variations are also possible. For example, the segments that are attached and electrically coupled need not be fully formed elongated EMI seals, but can comprise merely compressible cores that are then attached in a manner providing conductive surfaces and electrical coupling between the opposite surfaces between the seals. Examples are shown in FIGS. 7–10. In FIG. 7, conductive surface material 52 is joined electrically across opposite faces of the gasket along depressed seams 96. In this example, material 52 comprises continuous sheets disposed on each side of the gasket. On one side (the bottom as shown), the sheet material is flat, and on the other side is diverted in a narrow U-shape between each core segment 42. At the bottom of the U-shape, material 52 is electrically coupled, for example by conductive adhesive, or more preferably, by heat sealing material 52 along the seam sufficiently to bring the conductive fibers or the like of material 52 into contact. This forms a gasket providing the same shielding advantages as the foregoing embodiments, and is relatively easy to produce.

Figure 8:
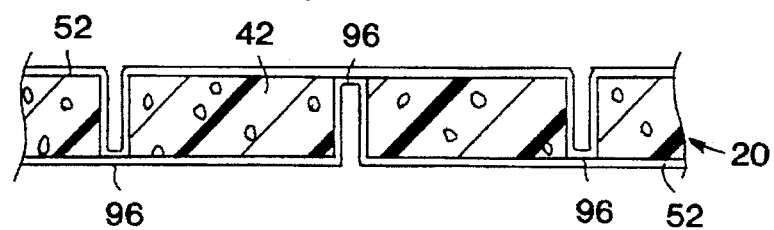
FIG. 8 illustrates a further embodiment similar to FIG. 7, in which the depressed seam lines are provided on opposite sides.
Figure 9A:
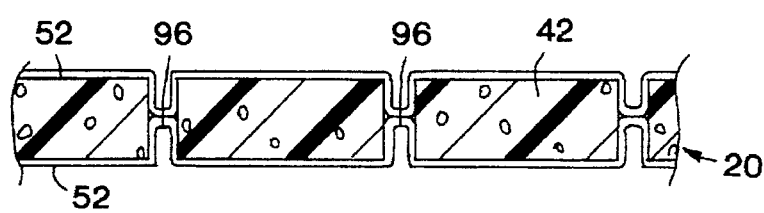
FIG. 9a shows an embodiment wherein the seam lines are formed by depressions on both sides of the gasket.

FIG. 8 illustrates a further embodiment similar to FIG. 7, in which the depressed seam lines 96 are provided in an alternating manner on opposite sides of gasket 20. FIG. 9a shows an embodiment wherein the seam lines 96 are formed by U-shaped depressions on both sides of the gasket; however, the depression on each side extends only part way through the thickness, e.g., half way. This allows gasket 20 to bend freely in either direction. As in FIGS. 7 and 8, material 52 can be heat sealed to achieve electrical coupling, or coupled using conductive adhesive.

Figure 9B:
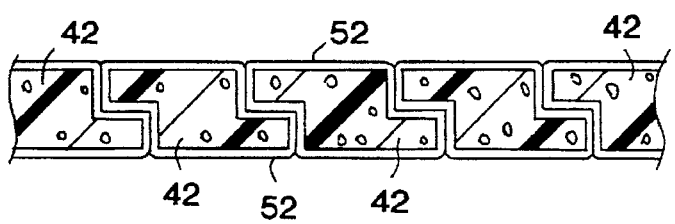
FIG. 9b shows an embodiment wherein the core segments are lapped, thereby offsetting the openings on opposite sides of the gasket.
Figure 9C:
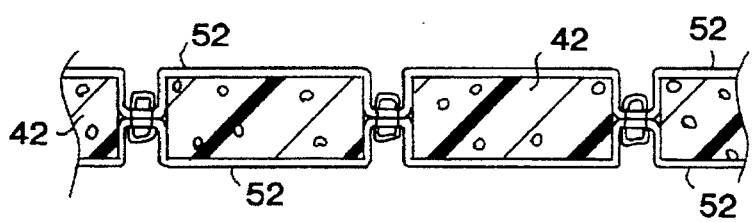
FIG. 9c shows an embodiment wherein adjacent segments are attached by a zigzag stitch crossing between adjacent segments.

In FIG. 9b, an alternative is shown wherein the segments lap on another and is thus similar to FIG. 9a except that the outer facing surfaces of the gasket are more continuous (i.e, the seam gaps are small).

Assuming the embodiments of FIGS. 7–9b employ conductive adhesive, the adhesive is thin. In FIG. 9c, a structure similar to FIG. 9a is provided, but the opposite portions of sheet material 52 are joined by conductive stitching. The stitching can be, for example, a zigzag stitch as shown, with each pass through material 52 located immediately adjacent a segment core 42. The stitching also can be passed directly through the core.

Figure 10:
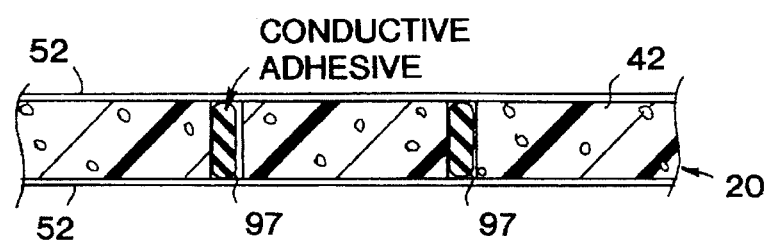
FIG. 10 shows a further embodiment wherein a conductive adhesive is provided between core segments wrapped commonly with a conductive sheet material, forming flat or relatively flat surfaces on both sides of the gasket.

By using a thick bead 97 of conductive adhesive as shown in FIG. 10, conductive material 52 can be flat and continuous on both sides of gasket 20. The conductive adhesive is provided between adjacent core segments 42, that are wrapped commonly with conductive sheet material 52. This provides electrical connection between opposite surfaces of gasket 20 in a manner similar to seams 96, provides a relatively smooth and continuous surface on both sides, and securely attaches the adjacent core segments 42.

In the embodiments of FIGS. 7–9a and 9c, the U-shaped depressions forming seams 96 preferably are kept narrow. Therefore, when gasket 20 is compressed between opposed conductive bodies, compression of core segments 42 tends to bulge the segments laterally and into contact with one another, closing the U-shape laterally. Provided seams 96 are suitably narrow, these embodiments thus also provide substantially continuous surface contact with the conductive bodies. The particular width of the U-shapes needed to achieve sufficient bulging to obtain contact will vary with the compression characteristics and the extent of compression of the core segments 42.

Figure 11:
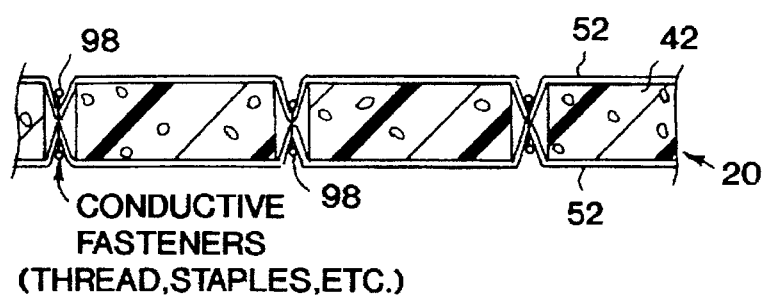
FIG. 11 shows a further embodiment having conductive fasteners in the form of conductive staples or stitches, electrically coupling between the segments across opposite faces of the gasket.

FIG. 11 illustrates a slightly different embodiment wherein seams 96 are formed using a linear conductive material 98 that pierces through the opposite layers of conductive material 52. This linear conductive material can be continuous, in the manner of stitching with wire or conductive thread or yarn, or discontinuous, in the manner of staples or perhaps an upholstery button tuft stitch.

Figure 12A:
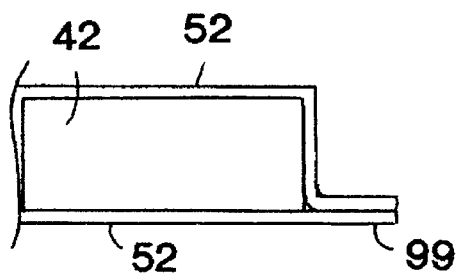
FIGS. 12a through 12f illustrate a series of techniques for dealing with the conductive sheet material along an edge of the gasket, for example along a longitudinal or lateral edge, or along a die cut.
Figure 12B:
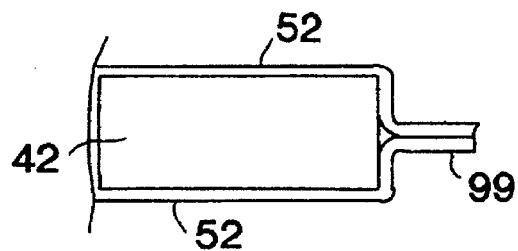

FIGS. 12a through 12f illustrate a series of techniques for dealing with the conductive sheet material along an edge of the gasket, for example along a longitudinal or lateral edge. These techniques can be used to cover over the foam core at an edge, either originally or after die cutting. In FIG. 12a, conductive material 52 is depressed from one side, similar to the seam of FIG. 7, and in FIG. 12b material 52 is depressed symmetrically on both sides as in the seam of FIG. 8. In either case the material 52 on opposite sides of gasket 20 is brought into electrical contact. The margins of material 52 along the edges can extend beyond the edge of the corresponding core segment 42 such that they can be heat sealed together or attached with conductive adhesive. In the event of a die cut that removes any material 52 extending beyond core 42, heat sealing can be used in part to melt a portion of core 42 such that the edges of material 52 can be brought together and heat sealed themselves.

Figure 12C:
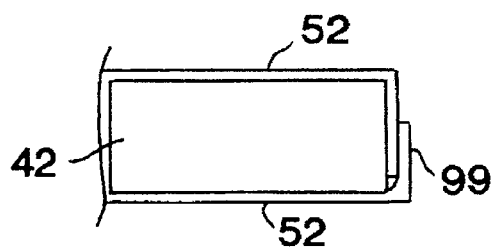
Figure 12D:
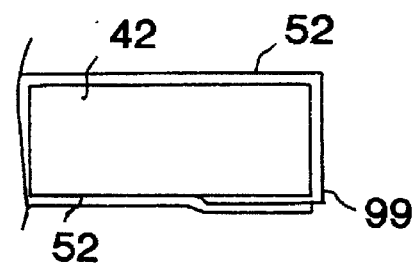
Figure 12E:
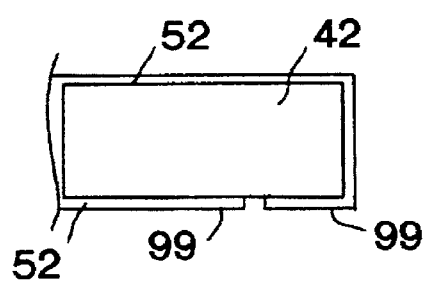
Figure 12F:
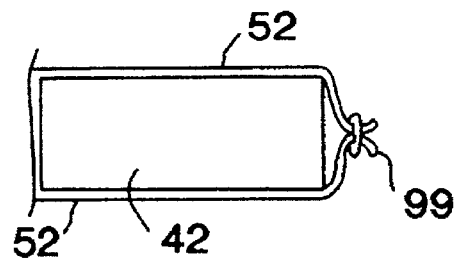

In FIGS. 12c and 12d, edges extending beyond the edge of core 42 are wrapped around the edge and overlapped, preferably being also heat sealed or coupled using conductive adhesive. The overlap can occur along the edge (FIG. 12c) or on one of the faces of gasket 20 (FIG. 12d). As shown in FIG. 12e, it may not be necessary to overlap the edges of conductive sheet 52 along an edge to achieve a conductive path between the opposite faces of gasket 20, around the edge. In FIG. 12e, the sheet 52 on one side (the top as shown) extends around the edge and resides along the margin of the opposite edge for making electrical contact with the corresponding conductive body. Preferably, however, any gap between the extreme edges of the conductive material 52 is minimal, e.g., 0.02 inch (0.5 mm) or less, to provide substantially full contact between gasket 20 and the conductive bodies. FIG. 12f illustrates that the connection of the terminal edges 99 can also be made by a conductive thread, staple or similar fastener, as discussed above.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A gasket for blocking electromagnetic radiation between at least two electrically conductive bodies over an arm having a length and a width, comprising:

a plurality of segments, each of the segments having a resilient core extending along at least part of one of the length and width, the segments being disposed laterally adjacent to one another between spaced edges of the gasket, such that at least two of the segments are laterally adjacent along said at least part of one of the length and width;

an electrically conductive material disposed on the segments and covering at least a majority of both opposite faces of the gasket, thereby providing conductive surfaces on both said opposite faces for bearing against the conductive bodies over said area; and, wherein the electrically conductive material includes conductive material bridging between the opposite faces at points between the spaced edges defining conductive paths between the opposite faces between the segments such that the conductive material defines a plurality of electrically parallel paths between the conductive bodies.

2. The gasket of claim 1, wherein the conductive material comprises a conductive sheet material extending between the segments from one of the opposite faces of the at least two laterally adjacent segments substantially to the other of the opposite faces, the conductive material bearing at both of the opposite faces against one of the conductive bodies.

3. The gasket of claim 1, wherein the conductive material comprises a conductive adhesive between the at least two laterally adjacent segments for electrically coupling the opposite faces of the segments.

4. The gasket of claim 1, wherein the conductive material comprises a conductive sheet material substantially covering the opposite faces and wherein the conductive material on the opposite faces is electrically coupled between the laterally adjacent segments by at least one of at least one depression in the conductive sheet material extending through the gasket between the segments, heat sealing the conductive sheet material through the gasket between the segments, a conductive adhesive joining the conductive sheet material, and a conductive fastener extending through the gasket.

5. The gasket of claim 4, wherein the conductive material further comprises an edge treatment coupling the conductive sheet material around a terminal edge of the gasket.

6. The gasket of claim 1, wherein the conductive material on the opposite faces is electrically coupled between the segments along at least one depression in the conductive sheet material on at least one of the opposite faces of the gasket, the conductive sheet material on the opposite faces being electrically coupled at a bottom of the at least one depression.

7. The gasket of claim 6, wherein the conductive sheet material on one of the opposite faces is substantially flat and the at least one depression is formed in the other of the opposite faces.

8. A gasket for blocking electromagnetic radiation between at least two electrically conductive bodies over an area having a length and a width, comprising:

a plurality of segments, each of the segments having a resilient core extending along at least part of one of the length and width;

an electrically conductive material disposed on the segments providing opposite faces for bearing against the conductive bodies, the segments being disposed adjacent to one another such that the plurality of segments encompasses said area, the electrically conductive material defining conductive paths between the opposite faces between the segments;

wherein the conductive material comprises a conductive sheet material covering at least a majority of both said opposite faces and wherein the conductive material on the opposite faces is electrically coupled between the segments along a plurality of oaths extending through the gasket between the segments.

9. The gasket of claim 6, wherein the opposite faces are electrically coupled by heat sealing at the bottom of at least one depression in at least one of the opposite faces.

10. The gasket of claim 6, wherein the opposite faces are electrically coupled by conductive adhesive at the bottom of at least one depression on at least one of the opposite faces.

11. The gasket of claim 6, wherein the opposite faces are electrically coupled by a conductive fastener extending through the gasket between the segments.

12. The gasket of claim 1 wherein the electrically conductive material comprises a metallized fabric sheet including a metalized polymer having at least one of woven, nonwoven, braided and knitted material.

13. The gasket of claim 12, wherein the polymer comprises a thermoplastic.

14. The gasket of claim 13, wherein the metallized fabric sheet comprises metal fibers.

15. The gasket of claim 1, wherein the conductive material is joined between the opposite faces on at least one terminal edge.

16. The gasket of claim 15, wherein the conductive material comprises a metallized polymer sheet and is overlapped for joining the conductive material along the at least one terminal edge.

17. The gasket of claim 16, wherein the polymer sheet is electrically coupled between the opposite faces along the terminal edge by at least one of conductive adhesive, heat sealing and a conductive fastener.

18. The gasket of claim 17, wherein the polymer sheet is heat sealed along the terminal edge for a distance encompassing a portion of one of the segments along the terminal edge.

19. The gasket of claim 8, wherein the conductive sheet material on one of the opposite faces is substantially flat and depressions are formed in the other of the opposite faces for providing the electrically conductive path.

20. The gasket of claim 8, wherein depressions are formed in both of the opposite faces for providing the electrically conductive path.

\* \* \* \* \*

UNITED STATES PATENT AND TRADEMARK OFFICE
CERTIFICATE OF CORRECTION

PATENT NO. : 5,646,369
DATED : July 8, 1997
INVENTOR(S) : Stanley R. Miska et al.

It is certified that error appears in the above-indentified patent and that said Letters Patent is hereby corrected as shown below:

Column 11, line 6, delete "yam" and substitute therefor --yarn--.

Column 11, line 55, delete "arm" and substitute therefor --area--.

Column 12, line 22, after "of" insert --:--.

Signed and Sealed this

Twenty-eighth Day of October, 1997

*Attest:*

BRUCE LEHMAN

*Attesting Officer*      *Commissioner of Patents and Trademarks*